United States Patent
Hu et al.

(10) Patent No.: US 9,053,263 B2
(45) Date of Patent: Jun. 9, 2015

(54) SCHEDULING DISCRETE EVENT SIMULATION

(71) Applicant: International Business Machines Corporation, Armonk, NY (US)

(72) Inventors: Guoqiang Hu, Shanghai (CN); Qi Cheng Li, Beijing (CN); Li Jun Mei, Beijing (CN); Fan Jing Meng, Beijing (CN); HuaFang Tan, Beijing (CN); Jian Wang, Beijing (CN); Yi Min Wang, Shanghai (CN); Zi Yu Zhu, Beijing (CN)

(73) Assignee: International Business Machines Corporation, Armonk, NY (US)

(*) Notice: Subject to any disclaimer, the term of this patent is extended or adjusted under 35 U.S.C. 154(b) by 49 days.

(21) Appl. No.: 13/868,655

(22) Filed: Apr. 23, 2013

(65) Prior Publication Data

US 2013/0304442 A1    Nov. 14, 2013

(30) Foreign Application Priority Data

Apr. 27, 2012 (CN) .......................... 2012 1 0130365

(51) Int. Cl.
   *G06G 7/48* (2006.01)
   *G06F 17/50* (2006.01)
(52) U.S. Cl.
   CPC .................................. *G06F 17/5009* (2013.01)
(58) Field of Classification Search
   CPC ................................................ G06F 17/5006
   USPC ............................................................ 703/6
   See application file for complete search history.

(56) References Cited

U.S. PATENT DOCUMENTS

| | | |
|---|---|---|
| 6,278,963 B1 | 8/2001 | Cohen |
| 7,246,054 B2 | 7/2007 | Szymanski et al. |
| 2009/0187395 A1 | 7/2009 | Manohar et al. |

OTHER PUBLICATIONS

Richard M. Fujimoto, "Parallel and Distributed Simulation Systems," 2000, John Wiley & Sons, pp. 1-300.*
Benno Overeinder et al. "Parallel Discrete Event Simulation," 1991, http://dare.uva.nl/record/117625, pp. 1-11.*
Nianle Su et al., "Optimistic parallel discrete event simulation based on multi-core platform and its performance analysis," 2009, International Conference on Complex, Intelligent and Software Intensive Systems, pp. 675-680.*

(Continued)

*Primary Examiner* — Kamini S Shah
*Assistant Examiner* — Russ Guill
(74) *Attorney, Agent, or Firm* — Penny L. Lowry; Jeff Tang

(57) ABSTRACT

The present invention provides a method, apparatus, and non-transitory article of manufacture embodying computer readable instructions for scheduling discrete event simulation. One embodiment of the present invention is a method for scheduling discrete event simulation. The method includes: extracting two or more event types in the discrete event simulation in response to having loaded the discrete event simulation; constructing a correlation graph used for the discrete event simulation based on the two or more event types; and scheduling events that are classified into the two or more event types according to the correlation graph wherein each node in the correlation graph describes one of the two or more event types, and an edge in the correlation graph describes the creation or dependency relationship between the two or more event types. Other embodiments of the present invention provide an apparatus and computer program product for scheduling discrete event simulation.

20 Claims, 10 Drawing Sheets

(56) References Cited

OTHER PUBLICATIONS

Voon-Yee Vee et al., "Parallel Discrete Event Simulation: A Survey," 1999, Citeseer, pp. 1-30.*

Homi Bodhanwala et al., "A General Purpose Discrete Event Simulator," 2001, Cireseer, pp. 1-13.*

Richard M. Fujimoto, "Parallel Discrete Event Simulation," 1990, Communications of the ACM, vol. 33, issue 10, pp. 30-53.*

Jason Liu et al., "Lookahead revisited in wireless network simulations," 2002, Proceedings of the sixteenth workshop on parallel and distributed simulation, pp. 79-88.*

Kalyan S. Perumalla, "Parallel and distributed simulation: traditional techniques and recent advances," 2006, Proceedings of the 38th conference Winter simulation, pp. 84-95.*

Yi-Bing Lin, "Parallelism analyzers for parallel discrete event simulation," 1992, ACM Transactions on Modeling and Computer Simulations, vol. 2, No. 3, pp. 239-264.*

G. Kunz et al., Runtime Efficient Event Scheduling in Multi-threaded Network Simulation, 4th International Workshop on OMNeT++, 2011.

* cited by examiner

SCHEDULING DISCRETE EVENT SIMULATION

CROSS-REFERENCE TO RELATED APPLICATION

This application claims priority under 35 U.S.C. §119 from Chinese Patent Application No. 201210130365.7 filed Apr. 27, 2012, the entire contents of which are incorporated herein by reference.

BACKGROUND OF THE INVENTION

1. Field of the Invention

The present invention relates to parallel processing, and more specifically, to a method, apparatus, and related computer program product for scheduling discrete event simulation.

2. Description of Related Art

With the development of computer hardware and software technology, it is possible to simulate people's daily work and life in more and more aspects. For example, it is possible to use discrete events for describing respective procedures in daily work and life (such as mobile communication network operation, data network operation, production line management, etc.) and further to use discrete event simulation for simulating the processing thereof.

Discrete event simulation abstracts change with time of a to-be-analyzed system to a series of events at discrete time points, process these events in temporal sequence, and thereby form an event-driven simulation world. Discrete event simulation regards the system's changes as events, so any change of the system can be implemented by processing a corresponding event.

As hardware technology like multicore processors develop, multicore CPU has become the mainstream configuration of computers, and hence multicore-based parallel processing technology draws more and more attention. However, most simulation platforms can hardly make effective use of CPU's such property as multicore in practical application. In this regard, simulating discrete events based on parallel processing technology has become a focus of research, with a view to improve the operation effectiveness of discrete event simulation and fully exploit the potential processing capability of multicore CPU.

Nevertheless, applications of existing discrete event simulation can hardly be implanted to a computer device that supports parallel processing. Current solutions highly depend on developers' and researchers' experience and require researchers to change their long-followed programming practice. This makes it difficult to fully use the parallel processing capability provided by hardware.

SUMMARY OF THE INVENTION

Therefore, how to process in parallel events more efficiently while being compatible with existing discrete event simulation has become an imminent problem to solve. To this end, embodiments of the present invention provide a method, apparatus, and related computer program product for scheduling discrete event simulation.

According to an aspect of the present invention, there is provided a method for scheduling discrete event simulation. The method includes: extracting two or more event types in the discrete event simulation in response to having loaded the discrete event simulation; constructing a correlation graph used for the discrete event simulation based on the two or more event types; and scheduling events that are classified into the two or more event types according to the correlation graph, wherein each node in the correlation graph describes one of the two or more event types, and an edge in the correlation graph describes the creation or dependency relationship between the two or more event types.

According to an aspect of the present invention, there is provided an apparatus for scheduling discrete event simulation. The apparatus includes: an extracting module configured to, extract two or more event types in the discrete event simulation in response to having loaded the discrete event simulation; an constructing module configured to construct a correlation graph used for the discrete event simulation based on the two or more event types; and a scheduling module configured to schedule events that are classified into the two or more event types according to the correlation graph, wherein each node in the correlation graph describes one of the two or more event types, and an edge in the correlation graph describes the creation or dependency relationship between the two or more event types.

Another aspect of the present invention provides a non-transitory article of manufacture tangibly embodying computer readable instructions, which when implemented, cause a computer to perform the steps of scheduling discrete event simulation, said method including the steps of: extracting two or more event types in the discrete event simulation in response to having loaded the discrete event simulation; constructing a correlation graph used for the discrete event simulation based on the two or more event types; and scheduling events that are classified into the two or more event types, according to the correlation graph, wherein each node in the correlation graph describes one of the two or more event types, and an edge in the correlation graph describes the creation relationship or dependency relationship between the two or more event types.

With the embodiments of the present invention, it is possible to transparently schedule discrete event processing simulation in parallel without changing the existing popular programming practice of simulation developers as much as possible. Moreover, it is possible to effectively use the parallel processing capability of hardware devices and thus improve the efficiency of scheduling discrete event simulation without the need to manually process parallel temporal simulation models by programmers.

BRIEF DESCRIPTION OF THE SEVERAL VIEWS OF THE DRAWINGS

Through the more detailed description of some embodiments of the present invention in the accompanying drawings, the above and other objects, features and advantages of the present disclosure will become more apparent, wherein the same reference generally refers to the same components in the embodiments of the present invention.

DETAILED DESCRIPTION OF THE PREFERRED EMBODIMENTS

Figure 1:
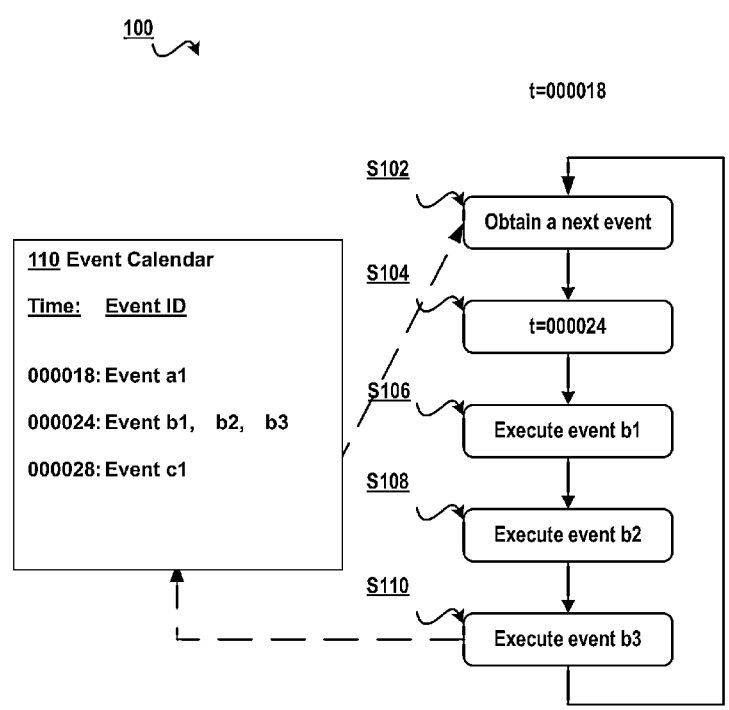
FIG. 1 illustrates a schematic view of a method for scheduling discrete event simulation according to an embodiment of the present invention.

Some preferable embodiments will be described in more detail with reference to the accompanying drawings, in which the preferable embodiments of the present invention have been illustrated. However, the present invention can be implemented in various manners, and thus should not be construed to be limited to the embodiments disclosed herein. On the contrary, those embodiments are provided for the thorough and complete understanding of the present invention, and completely conveying the scope of the present invention to those skilled in the art.

As will be appreciated by one skilled in the art, aspects of the present invention can be embodied as a system, method, or computer program product. Accordingly, aspects of the present invention can take the form of an entirely hardware embodiment, an entirely software embodiment (including firmware, resident software, micro-code, etc.), or one embodiment combining software and hardware aspects that can all generally be referred to herein as a "circuit," "module" or "system." Furthermore, aspects of the present invention can take the form of a computer program product embodied in one or more computer readable medium(s) having computer readable program code embodied thereon.

Any combination of one or more computer readable medium(s) can be utilized. The computer readable medium can be a computer readable signal medium or a computer readable storage medium. A computer readable storage medium can be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the present invention a computer readable storage medium can be any tangible medium that can contain or store a program for use by or in connection with an instruction execution system, apparatus, or device.

A computer readable signal medium can include a propagated data signal with computer readable program code embodied therein, for example, in baseband or as part of a carrier wave. Such a propagated signal can take any of a variety of forms, including, but not limited to, electro-magnetic, optical, or any suitable combination thereof. A computer readable signal medium can be any computer readable medium that is not a computer readable storage medium and can communicate, propagate, or transport a program for use by or in connection with an instruction execution system, apparatus, or device.

Program code embodied on a computer readable medium can be transmitted using any appropriate medium, including, but not limited to, wireless, wireline, optical fiber cable, RF, or any suitable combination of the foregoing.

Computer program code for carrying out operations for aspects of the present invention can be written in any combination of one or more programming languages, including an object-oriented programming language such as Java, Smalltalk, C++ or the like, and conventional procedural programming languages, such as the "C" programming language or similar programming languages. The program code can execute entirely on the user's computer, partly on the user's computer, as a stand-alone software package, partly on the user's computer and partly on a remote computer, or entirely on the remote computer or server. If entirely on the remote computer or server, the remote computer can be connected to the user's computer through any type of network, including a local area network (LAN), a wide area network (WAN), or the connection can be made to an external computer (for example, through the Internet using an Internet Service Provider).

Aspects of the present invention are described below with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions can also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions can also be loaded onto a computer, other programmable data processing apparatus, or other devices to cause a series of operational steps to be performed on a computer, other programmable apparatus, or other devices to produce a computer implemented process such that the instructions which execute on the computer or other programmable apparatus provide processes for implementing the functions/acts specified in the flowchart and/or block diagram block or blocks.

FIG. 1 illustrates a schematic view 100 of a method for scheduling discrete event simulation according to an embodiment of the present invention. At present, most applications of discrete event simulation run in a single-threaded shared-memory programming environment. Due to limited computing resources and causal relationships between events, pluralities of discrete events are usually processed in series.

As illustrated in FIG. 1, Event Calendar 110 records respective events at simulation application runtime, wherein "Time" denotes the occurrence time of a specific event and "Event ID" uniquely identifies the specific event. In the context of the present invention, "Time" can be represented in various manners and use various time units. For example, on the Event calendar 110 "000018," "000024" and "000028" are merely schematic representations. "000018" does not represent a particular time moment in "time/minute/second" but represents a relative time unit; for example, each time unit can indicate 100 milliseconds, 1 second or 1 minute in real world. Now each data on the Event Calendar 110 is explained 1) "000018: Event a1" represents that the occurrence time of an event a1 is 000018

2) "000024: Events b1, b2, b3" represents that the occurrence time of each of events b1, b2 and b3 is 000024 (that is, events b1, b2 and b3 can be processed in parallel at time 000024);

3) "000028: Event c1" represents that the occurrence time of an event c1 is 000028.

Blocks S102-S110 at the right side of FIG. 1 illustrate a procedure of executing each event on the Event Calendar 110 in the single-threaded shared-memory computing environment. Suppose a current time t=000018, after the completion of the event a1, an event at the next time point is obtained in block S102. Due to limited computing resources, the events b1, b2 and b3 that could be executed in parallel at time t=000024 in block S104 can only be executed in series. The event b1 is executed in block S106, the event b2 is executed in block S108, and afterwards the event b3 is executed in block S110.

It should be noted that a dashed arrow on the left side of block S110 represents that the Event Calendar 110 is not static but can be dynamically updated as respective events (such as the events b1, b2 and b3) are executed. For example, the event b1 executed in block S106 can further create a new event d1, and the newly created event d1 will enter the Event Calendar 110. The arrow circulating from block S110 upwards to block S102 represents that the processing of respective events is a cyclic procedure of continuously processing to-be-processed events on the event calendar 110 as the Event Calendar 110 is updated.

Figure 2:
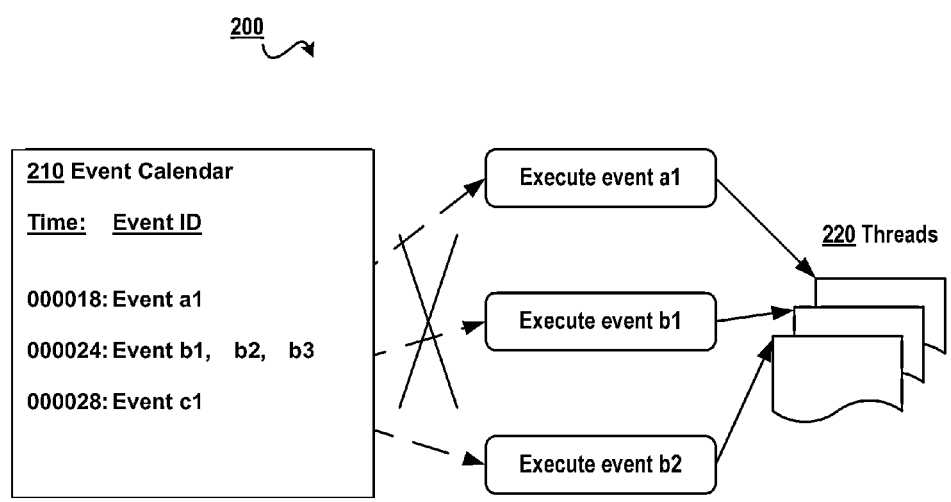
FIG. 2 illustrates a schematic view of a problem that exists during scheduling discrete event simulation in a multicore processor system.

FIG. 2 illustrates a schematic view 200 of a problem that exists during scheduling discrete event simulation in a multicore processor system. In the multicore processor system, since there are additional computing resources, different events on an Event Calendar 210 can be executed by a multithread 220. However, due to the possible existence of a strict temporal dependency relationship between the event a1 and the events b1, b2, b3 (the events b1, b2 and b3 should be executed after the event a1), in the absence of additional information for hinting at such a temporal dependency relationship, the events a1, b1 and b2 cannot be simultaneously executed by the multithread 220 so as to ensure the correctness of simulation. As a result, some threads might be always in idle status, and in turn, computing resources are wasted.

Figure 3:
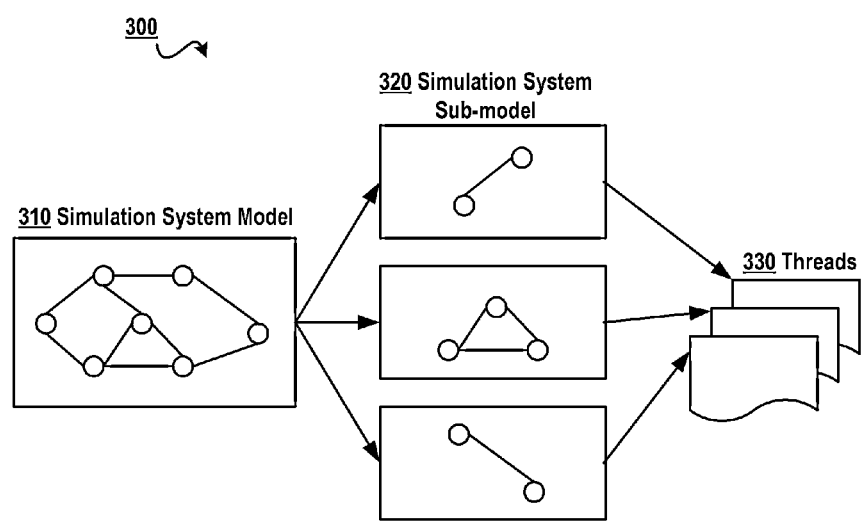
FIG. 3 illustrates a schematic view of a method for scheduling discrete event simulation in a multicore processor system according to another embodiment of the present invention.

Regarding the problem illustrated in FIG. 2, FIG. 3 illustrates a schematic view 300 of a method for scheduling discrete event simulation in a multicore processor system according to another embodiment of the present invention. With the development of multicore processor technology, there is proposed a method for manually partitioning a discrete event simulation model (such as a simulation system model 310 in FIG. 3) into multiple sub-models (such as simulation system sub-model 320 in FIG. 3) based on a temporal dependency relationship between respective discrete events, so as to improve the parallel processing capability of discrete event simulation. At this point, since respective events in the multiple sub-models have no or little temporal dependency relationship, they can be executed in parallel using different Threads 330, and the little temporal dependency relationship between sub-models can be processed using an inter-thread synchronization mechanism. Although this scheme can use the parallel processing capability of multicore processors to a certain extent, the application scope of this scheme is limited by a number of factors, because this scheme highly depends on developers' and researchers' technical experience and requires additional partitioning.

In addition, there is further proposed a novel discrete event simulation engine (refer to G. Kunz et al.: "Runtime Efficient Event Scheduling in Multi-threaded Network Simulation," $4^{th}$ International Workshop on OMNeT++, 2011), so as to schedule discrete event simulation more efficiently. However, this scheme depends on a new, distinct event modeling method, breaks programmers' routines and hence can hardly be put into wide application fast and efficiently.

In order to process in parallel events more efficiently while being compatible with existing discrete event simulation, embodiments of the present invention provide a method, apparatus, and related computer program product for scheduling discrete event simulation. In one embodiment of the present invention, there is provided a method for scheduling discrete event simulation, the method includes: extracting two or more event types in the discrete event simulation in response to having loaded discrete event simulation; constructing a correlation graph used for the discrete event simulation based on the two or more event types; and scheduling events that are classified into the two or more event types according to the correlation graph, wherein each node in the correlation graph describes one of the two or more event types, and an edge in the correlation graph describes a creation relationship or a dependency relationship between the two or more event types.

Figure 4:
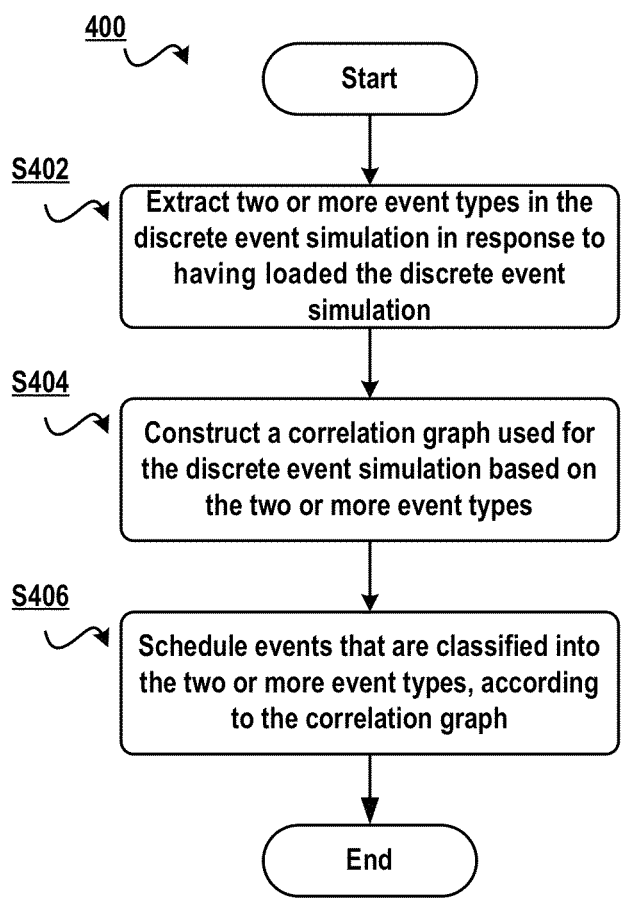
FIG. 4 schematically illustrates a flowchart of a method for scheduling discrete event simulation according to one embodiment of the present invention.

FIG. 4 schematically illustrates a flowchart 400 of a method for scheduling discrete event simulation according to one embodiment of the present invention. In block S402, two or more event types in discrete event simulation are extracted in response to having loaded the discrete event simulation. In this embodiment the loaded discrete event simulation is not static code describing a simulation application, but a dynamic instance that is generated in runtime on the basis of particular environment configuration and input during operation of the application. For example, suppose the simulation application is written in an object-oriented language such as C++, then the extracted event type corresponds to an instance of an instantiated event generator and/or event processor in runtime, rather than a static-class statement.

In block S404, a correlation graph used for the discrete event simulation is constructed based on the two or more event types. In this embodiment, each node in the correlation graph describes one of the two or more event types, and an edge in the correlation graph describes a creation relationship or a dependency relationship between the two or more event types. For example, an event type A and an event type B in the two or more event types can be described by a node A and a node B, respectively.

In this embodiment of the present invention, an edge between nodes is a directed edge. If the event type A creates the event type B, then between the node A and the node B there is a first-type edge representing a creation relationship, the edge pointing from the node A to the node B. If the event type A temporally depends on the event type B, then between the node A and the node B is a second-type edge representing a dependency relationship, the edge pointing from the node B to the node A.

In block S406, events that are classified into the two or more event types are scheduled according to the correlation graph. Based on whether or not there is an edge between two modes and based on a type of the edge, it is possible to schedule events of event types represented by the two nodes. For example, if there is no dependency relationship between the two nodes (for example, neither direct dependency relationship nor indirect dependency relationship that is sequentially connected by directed edges representing creation and dependency), then events that are classified into these two event types can be executed in parallel, or else further judgment is needed.

It should be noted that in the context of the present invention, "event type" is a general term for one class of events. For example, "generating a packet at a node" can be an event type, while the operation of "generating a packet at a node" at different time points can be multiple events of the event type—"generating a packet at a node," that is, the event is a particular event classified into the event type—"generating a packet at a node." For the purpose of simplicity, in this specification "event(s) of a certain event type" can represent one or more events that are classified into a certain event type, while "event type of a certain event" can represent an event type to which the certain event belongs.

Figure 5A:
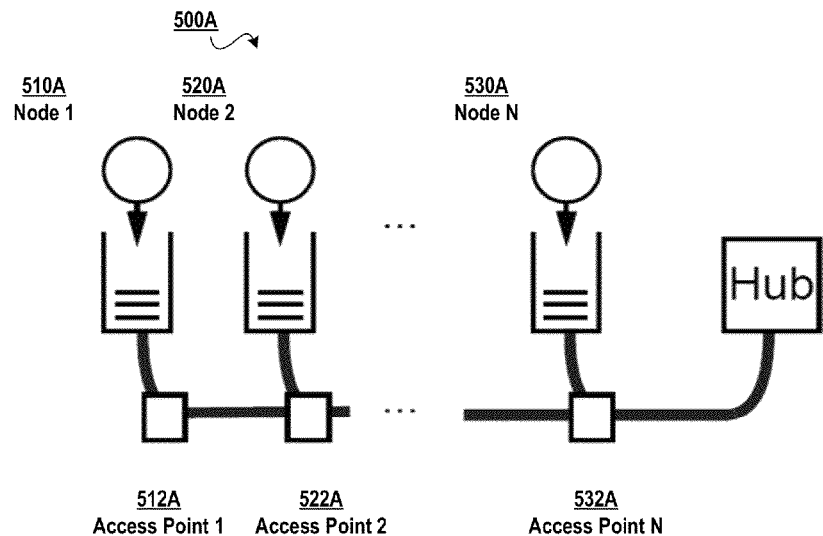
FIG. 5A illustrates a schematic view of the operation procedure of a communication network.

With reference to particular examples of simulating discrete events, description is now presented to a method and apparatus according to the present invention. FIG. 5A illustrates a schematic view 500A of the operation procedure of a communication network. In FIG. 5A, symbols 510A, 520A, ..., 530A illustrated in circles represent nodes 1, 2, ..., N in the communication network; symbols 512A, 522A, ..., 532A illustrated in blocks at the bottom of FIG. 5A represent access points 1, 2, ..., N in the communication network; lines between respective access points represent transmission paths over which data can be transmitted. Delay exists when transmitting data over the transmission path, the delay representing temporal overheads for the data transmission.

When the communication network illustrated in FIG. 5A is operating, nodes 1 510A, 2 520A, ..., 3 530A each can generate a packet at the same or different times and transmit the generated packet to access points 1 512A, 2 522A, ..., N 532A, respectively. The generated packet can be buffered at a queue (not illustrated) between a node and a corresponding access point. Next, the access points 1 512A, 2 522A, ..., N 532A each can transmit the received packet to Hub via the transmission path. There is transmission delay between the access points 1 512A, 2 522A, ..., N 532A.

Regarding the communication network illustrated in FIG. 5A, events in the communication network 500A can be described by a data structure illustrated in Table 1.

TABLE 1

Event Description

| Event Generator Class | Event Generator Object | Event Type |
|---|---|---|
| Generator | Generator1 | Packet Generation@Node1 |
| | Generator2 | Packet Generation@Node2 |
| AP | AP1 | Transmission End @AP1 |
| | AP2 | Transmission End @AP2 |
| Delayer | Delayer1 | Delay Timeout @Delayer1 |
| | Delayer2 | Delay Timeout @Delayer2 |

Figure 5B:
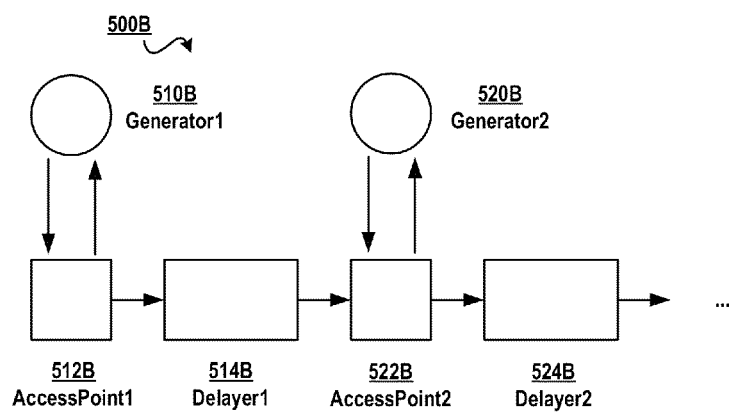
FIG. 5B illustrates a schematic view of simulating and modeling the communication network illustrated in FIG. 5A according to one embodiment of the present invention.

FIG. 5B illustrates a schematic view 500B of simulating and modeling the communication network illustrated in FIG. 5A according to one embodiment of the present invention. With reference to Table 1, event generators generating packets at nodes in FIG. 5 are described using the class Generator, and after being instantiated, they are represented by objects, Generator1 510B and Generator2 520B for a Node1 and a Node2, respectively. Similarly, event generators related to access points in FIG. 5A are described using the class AP (short for "Access Point"), and for the Access Point 1 and the Access Point 2, they are represented by the objects AP1 512B and AP2 522B, respectively; and delay on the transmission path is described by the class Delayer. For example, the delay between the Access Point 1 512A and the Access Point 2 522A can be represented by the object Delayer1 (corresponding to a Delayer1 514B) and the delay between the Access Point 2 522A and another Access Point (not shown) can be represented by the object Delayer2 (corresponding to a Delayer2 524B). As illustrated in Table 2, Packet Generation @Node1 represents that a packet is generated at the Node 1, Transmission End @AP1 represents that transmission ends at the Access Point 1, and Delay Timeout @Delayer1 represents that delay timeout occurs at a transmission path 1.

It should be noted that FIGS. 5A and 5B merely illustrate particular examples of simulation by using the method of the present invention. However, the method of the present invention is not limited to simulating a communication network, but can be used for simulating other systems such as a data network, production line management, etc.

Figure 6:
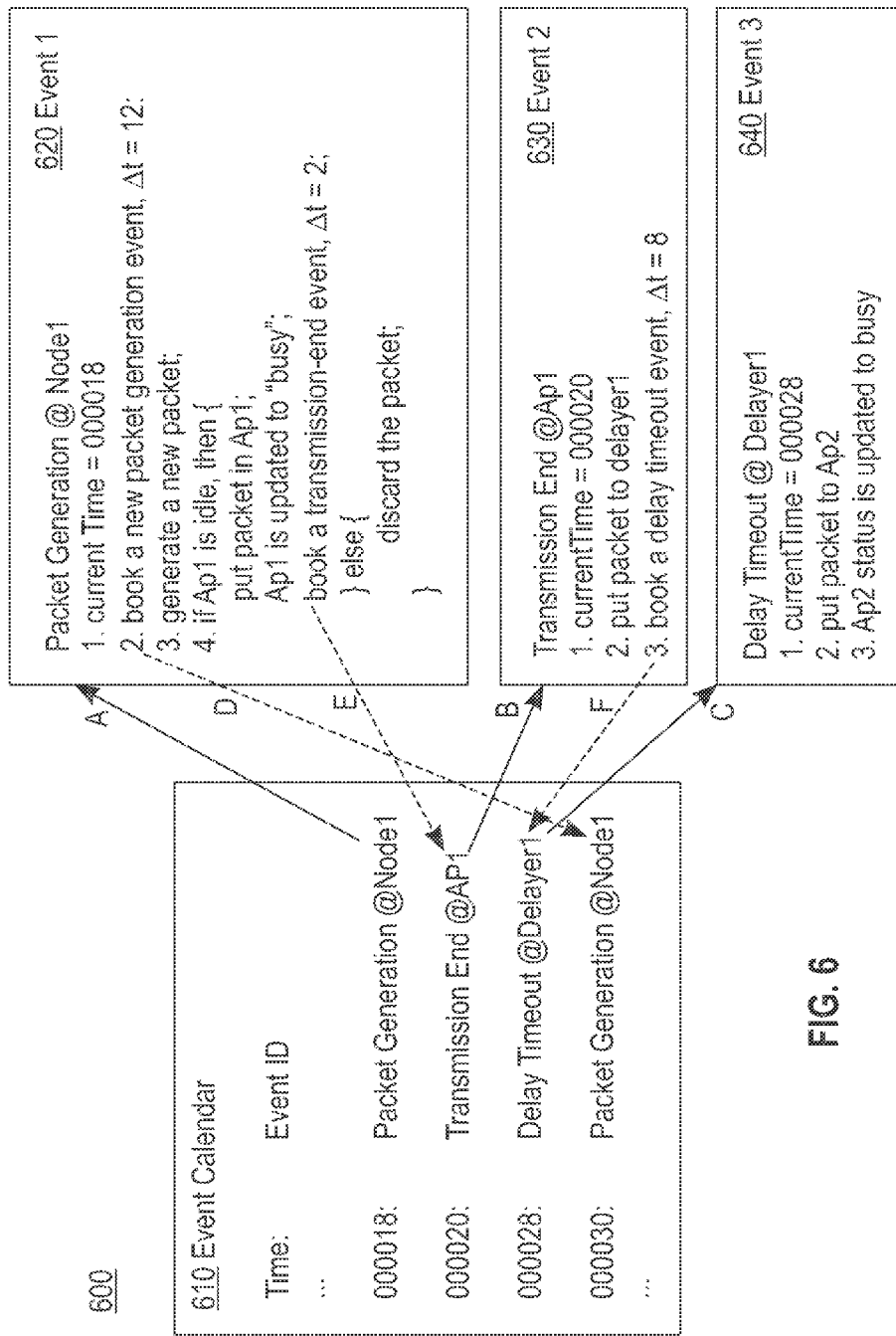
FIG. 6 schematically illustrates an event calendar related to discrete events in a communication network.

With reference to FIG. 6 hereinafter, detailed description is presented to how to construct a creation relationship and a dependency relationship. FIG. 6 schematically illustrates an event calendar 600 related to discrete events in a communication network. Specifically, blocks 620, 630, and 640 at the right side of FIG. 6 illustrate concrete execution contents of multiple events recorded on the Event Calendar 610. For example, execute "Packet Generation @Node1" (the content is as illustrated in a block Event 1 620) at the time 000018, in which event there is further included code for creating new events: code (1) "book a new packet generation event, Δt=12"; and code (2) "book a delay timeout event, Δt=8."

The code (1) creates a new event, which represents that a new packet is to be generated at the node 1 after 12 time units. As illustrated by a dashed arrow D, the code (1) causes an entry "000030: Packet Generation @Node1" to be inserted into the Event Calendar 610. Similarly, the code (2) creates another new event, which represents that transmission is to end at the access point 1 after 2 time units. As illustrated by a dashed arrow E, the code (2) causes an entry "000020: Transmission End @AP1" to be inserted into the Event Calendar 610. Similarly, the code (3) "book a delay timeout event, Δt=8" in an Event 2 630 inserts an entry "000028: Delay Timeout @Delayer1" into the Event Calendar 610 (as illustrated by a dashed arrow F). It should be noted that in the embodiment of the present invention the content of the Event Calendar 610 is dynamically updated.

In one embodiment of the present invention, the constructing a correlation graph used for the discrete event simulation based on the two or more event types includes: for one of the two or more event types, obtaining an event type of a new event that is created by an event classified into the event type; and constructing a creation relationship between the event type and the event type of the new event.

In FIG. 6, the code (1) in Event 1 620 creates a new event (Event 1 620), and thus there is a creation relationship between the event type of Event 1 620 and the event type of itself. For another example, the code (2) in Event 1 620 creates a new Event 2 630, and thus there is a creation relationship between the event type of Event 1 620 and the event type of Event 2 630. The code (3) in Event 2 630 creates a new event, Event 3 640, and thus there is a creation relationship between the event type of Event 2 630 and the event type of Event 3 640.

In one embodiment of the present invention, the constructing a correlation graph used for the discrete event simulation based on the two or more event types includes: constructing a dependency relationship between the two or more event types by analyzing the discrete event simulation and based on scenario configuration of the discrete event simulation. For example, it is possible to construct a dependency relationship between the two or more event types by analyzing a discrete event simulation program under concrete discrete event simulation scenario configuration. In the present invention the dependency relationship is a temporal dependency relationship.

As illustrated in FIG. 6, an Event 3 640 includes code (4) "AP2 status is updated to 'busy'." At this point, if a packet is generated at the node 2, corresponding to the event "Packet Generation @Node2", then the event will be affected.

Figure 7A:
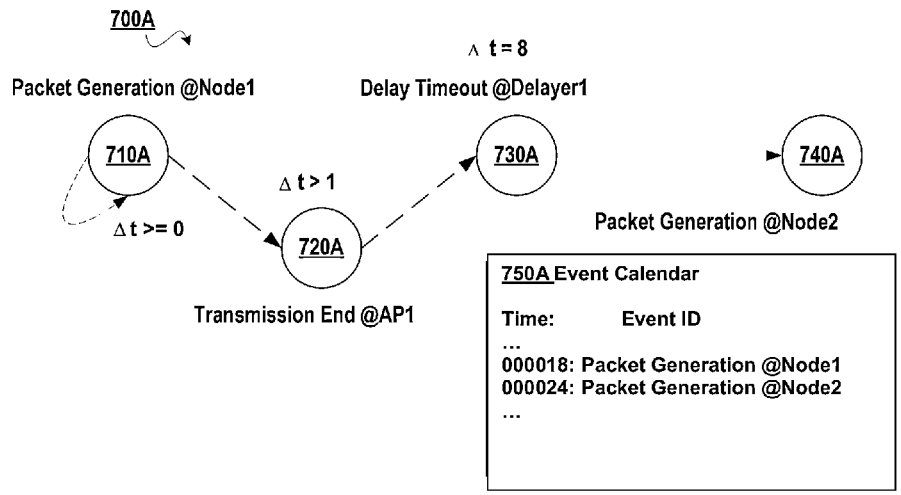
FIG. 7A schematically illustrates a correlation graph of discrete event simulation as constructed according to one embodiment of the present invention/

If an event type is represented by a circle, a creation relationship is represented by a dashed arrow and a dependency relationship is represented by a solid arrow, then the events in FIG. 6 and relationships between them can be illustrated as in FIG. 7A. FIG. 7A schematically illustrates a correlation graph 700A for discrete event simulation as constructed according to one embodiment of the present invention. In FIG. 700A, 710A represents the event type "Packet Generation @Node1," 720A represents the event type "Transmission End @AP1," 730A represents the event type "Delay Timeout @Delayer1," and 740 represents an event type "Packet Generation @Node2."

Regarding the foregoing description, a dashed arrow starting from the event type 710A and terminating at itself represents that an event of the event type 710A creates an event of the same event type (corresponding to the code (1) in the Event 1 620 in FIG. 6).

Similarly, a dashed line starting from the event type 710A and terminating at the event type 720A represents that an event of the event type 710A creates an event of the event type 720A (corresponding to the code (2) in the Event 1 620 in FIG. 6); a dashed arrow starting from the event type 720A and terminating at the event type 730A represents that an event of the event type 720A creates an event of the event type 730A (corresponding to the code (3) in the Event 2 630 in FIG. 6); and a solid arrow starting from the event type 730A and terminating at the event type 740A represents that an event of the event type 740A can depend on an event of the event type 730A (corresponding to code (4) in an Event 3 640 in FIG. 6).

Through the above-described specific embodiment in conjunction with the correlation graph generated in FIG. 7A, one skilled in the art can learn a specific embodiment of generating a correlation graph. It should be noted that although the foregoing examples merely illustrate obtaining a dependency relationship based on analyzing discrete event simulation (i.e., analyzing the code (4) in the Event 3 640 in FIG. 6), a dependency relationship between events can be further obtained based on scenario configuration of discrete event simulation in one embodiment of the present invention. For example, it is possible to explicitly define in a scenario configuration file that an event 740A depends on an event 730A in FIG. 7A.

In one embodiment of the present invention, an edge describing a creation relationship in the correlation graph at least includes a temporal correlation value of a creation relationship, the temporal correlation value representing an interval between the time when an event classified into an event type related to the edge is created and the occurrence time of the event. As illustrated in FIG. 7A, the temporal correlation value $\Delta t$ is illustrated at a terminal node of a corresponding creation relationship.

Now the definition of the temporal correlation value $\Delta t$ is explained in detail. Returning to FIG. 6, "book a new packet generation event, $\Delta t=12$" is defined in the code (1) of the Event 1 620. At this point, "$\Delta t=12$" represents that the interval between the time (i.e., current time "000018") when a new event is created and the occurrence time of the new event is 12 time units, so it can be learned that the occurrence time of the new event is 000018+12=000030. Hence, an entry "000030: Packet Generation @Node1" is inserted into the Event Calendar 610.

Similarly, one skilled in the art can grasp the definitions of "$\Delta t=2$" and "$\Delta t=8$" in FIG. 6 and correlate these temporal correlation values $\Delta t$ to specific creation relationship in FIG. 7 (for example, correlating "$\Delta t=8$" to the creation relationship between the event types 720 and 730 in FIG. 7). In one embodiment of the present invention, the temporal correlation value $\Delta t$ can be defined based on temporal correlation rules or defined manually.

In one embodiment of the present invention, the scheduling events that are classified into the two or more event types, according to the correlation graph includes: for a first event and a second event that are classified into two or more event types, calculating a time difference between an occurrence time of the second event and an occurrence time of the first event; if the time difference is less than a temporal correlation distance between an event type of the second event and an event type of the first event, executing the second event in parallel with the first event.

One purpose of calculating the temporal correlation distance between the second event and the first event is to determine the earliest possible time at which an event depending on the first event and belonging to the same event type as the second event would occur after the first event. If the earliest possible occurrence time is later than an impending occurrence time of the second event as recorded on the event calendar, although the connectivity between corresponding nodes in the correlation graph indicates that the second event might depend on the first event, the second event actually does not depend on the first event in the current case.

In one embodiment of the present invention, the temporal correlation distance between the event type of the second event and the event type of the first event is equal to a sum of minimum temporal correlation values of the creation relationship between the second node representing the event type of the second event and the first node representing the event type of the first event in the correlation graph.

In one embodiment of the present invention, it is possible to obtain a minimum temporal correlation value associated with each creation relationship. For example, if the temporal correlation value merely depends on a constant, then the minimum temporal correlation value is determined as a constant; if the temporal correlation value depends on a random number value generated by a certain probability distribution function, then a minimum non-negative value of the probability distribution function can be further checked and used as the minimum temporal correlation value; if the temporal correlation value is a combination of the above cases, for example being a temporal parameter depending on a constant and a random number, then the minimum temporal correlation value can be determined based on the constant value and a minimum non-negative value of the random function, etc. It is to be understood that multiple particular embodiments of determining a minimum temporal correlation value have been described above, one skilled in the art can calculate a minimum temporal correlation value associated with each event according to a particular application environment of the discrete event simulation.

Figure 7B:
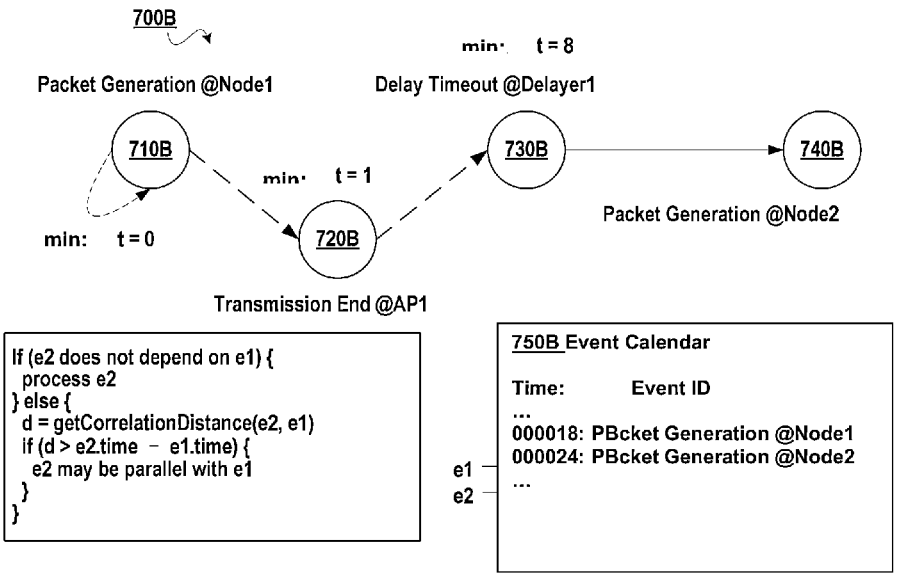
FIG. 7B illustrates a schematic view of a method for scheduling discrete event simulation according to one embodiment of the present invention.

FIG. 7B illustrates a schematic view 700B of a method for scheduling discrete event simulation according to one embodiment of the present invention. Event types 710B-740B in FIG. 7B correspond to the event types 710A-740A in FIG. 7A, respectively, and an Event Calendar 750B corresponds to an Event Calendar 750A. To calculate whether an event of the event type 740B can be executed in parallel with an event of the event type 710B, it is necessary to sum minimum temporal correlation values (1 and 8, respectively) of creation relationships (the event type 710B to 720B, the event type 720B to 730B) represented by respective dashed lines between the event type 740B and the event type 710B. The temporal correlation distance between the event type 740B and the event type 710B is equal to 1+8=9. Furthermore, as is clear from the Event Calendar 750B, the difference between the occurrence time of an event of the event type 740B and the occurrence time of an event of the event type 710B is equal to (000024−000018)=6. Since (1+8)=9>6, the event of the event type 740B can be executed in parallel with the event of the event type 710B.

If a conventional dependency relationship algorithm is used, since the event type 740B indirectly depends on the event type 710B, events of these two event types cannot be executed in parallel, but the event of the event type 740B should be executed after the event of the event type 710B is executed. It can be seen that by means of the embodiment of the present invention, the efficiency of scheduling discrete event simulation can be improved and more events can be executed in parallel.

In a block at the left side of the bottom of FIG. 7B there is illustrated pseudo code of implementing a method according to one embodiment of the present invention. As illustrated, events e1 and e2 in the pseudo code correspond to two events that are classified into the event types 710B and 740B in FIG. 7B, respectively. If the events e1 and e2 have no dependency relationship, then these two events can be executed in parallel without judging a temporal correlation distance between e1 and e2. In the example illustrated in FIG. 7B, since the events e2 and e1 have a dependency relationship, the temporal correlation distance d between e2 and e1 needs to be calculated. Next, judgment is made as to whether or not d is greater than a time difference (e2.time−e1.time) between the occurrence time (000024) of the event e2 and the occurrence time (000018) of the event e1. If the judgment results in "yes," then the event e2 is executed in parallel with the event e1.

The particular method for scheduling two or more events according to a correlation graph has been described with reference to the figures. Hereinafter, a detailed description will be presented as to how to schedule respective events on an event calendar of discrete event simulation.

In one embodiment of the present invention, the second event is an event on the event calendar of the discrete event simulation. In one embodiment of the present invention, the first event is an event that is being processed, or a to-be-processed event on the event calendar whose occurrence time is before the second event.

One skilled in the art should understand that the event calendar records a queue of events in the discrete event simulation which are to be but not yet executed, and the queue is dynamically updated with the execution of events. It is an object of the present invention to execute multiple events in parallel as much as possible. Hence, an event on the event calendar can be compared with an event that is being executed or to be executed. If a temporal correlation distance between these two events and an occurrence time difference between them meet the above requirement, then the two events can be executed in parallel.

In one embodiment of the present invention, the executing the second event in parallel with the first event includes: executing the second event by using the idle computing resources in response to the existence of idle resources and removing the second event from the event calendar. A basis for executing in parallel multiple events during the discrete event simulation is that there exist idle computing resources that can be used for executing parallel-executable events; if there exist no idle resources, then it is necessary to wait for the execution of an event being executed to be completed and release computing resources. Hence, when it is judged that idle computing resources become available, the computing resources are used to execute a specific event on the event calendar (the specific event can be executed in parallel with all events being executed or all events before the specific event on the event calendar). Once the specific event is started to be executed, this event is removed from the event calendar. In addition, when the execution of an event is completed, computing resources occupied by the event can be released so as to be used for executing other event.

In one embodiment of the present invention, the method is implemented in a multicore processor system. An advantage of using a multicore processor system is that more computing resources can be provided to implement discrete event simulation in parallel. In a multicore processor system, two or more events in discrete event simulation can be processed in parallel by using multiple processes and/or multiple threads, whereby the performance of simulation is improved.

Figure 8:
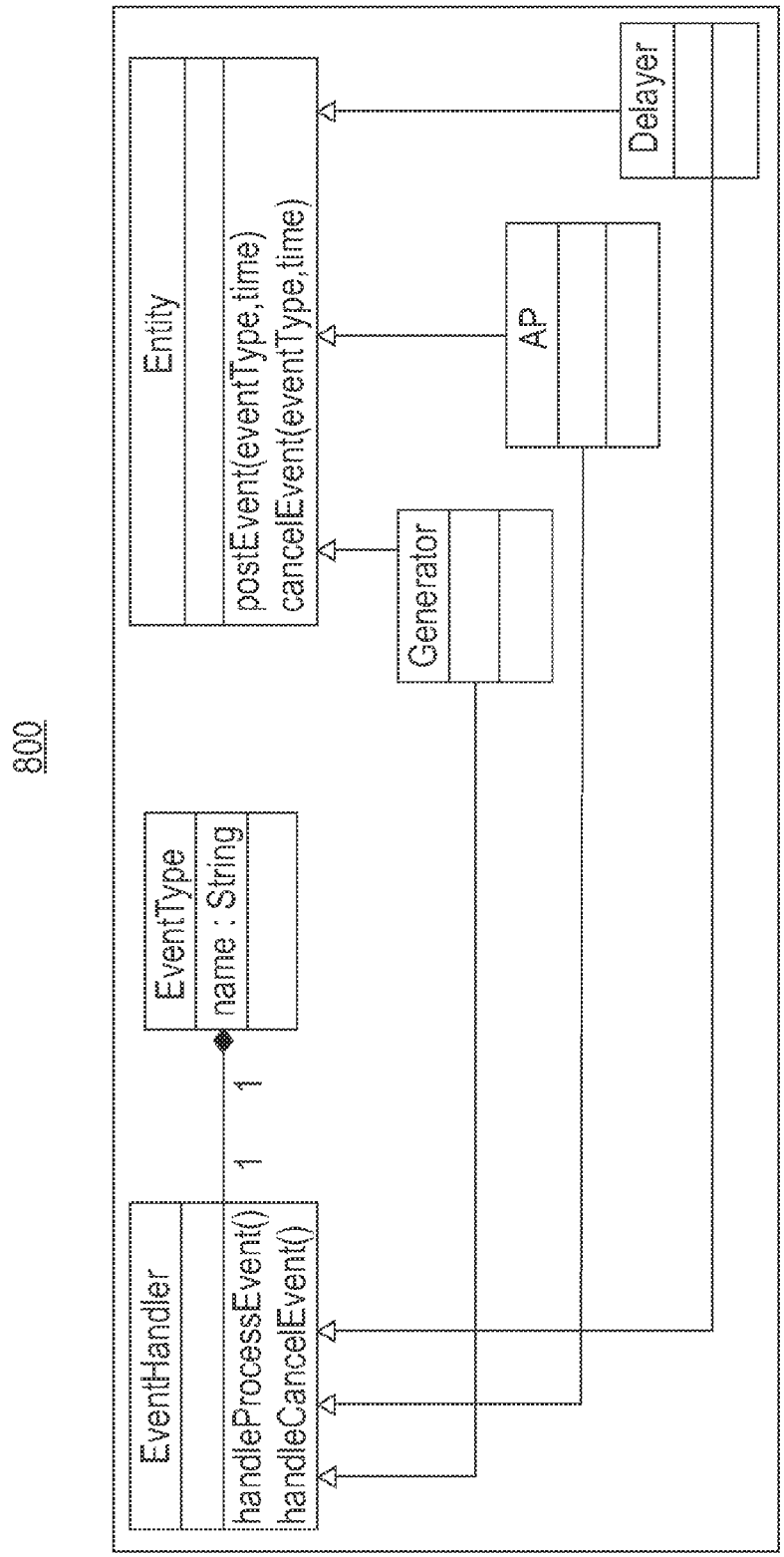
FIG. 8 illustrates a schematic view of a program design implemented in an object-oriented programming language according to one embodiment of the present invention.

Description will be presented below to a data structure for implementing embodiments of the present invention. In one embodiment of the present invention, an object-oriented programming language can be used to implement a method according to the present invention. FIG. 8 illustrates a schematic view 800 of a program design implemented in an object-oriented programming language according to one embodiment of the present invention. In the above-described example of discrete event simulation described using Generator, AP, and Delayer, when object-oriented programming is used, a class "Entity" as illustrated in FIG. 8 can be used as a base class of the classes Generator, AP, and Delayer.

The class Entity can have two methods: a method postEvent (eventType, time) for inserting a new event into an event calendar, wherein when inserting a newly created event, an event class and occurrence time of the event should be specified; and a method cancelEvent (eventType, time) for cancelling a specific event from an event calendar. Regarding the above-described example, event classes can be Packet Generation, Transmission End and Delay Timeout. Each event class corresponds to one EventHandler class.

In a particular implementation, first a loaded and initialized simulation application can be scanned, and all event types involved in the application are extracted, such as Packet Generation @Node1, Transmission End @AP1, Delay Timeout @Delayer1, and Packet-Generation @Node2. Subsequently, a correlation graph is constructed using the method described above, and a temporal correlation distance for each event is obtained.

In one embodiment of the present invention, the dependency relationship (illustrated by real segments in FIGS. 7A and 7B) between an event type A and an event type B (A can be equal to B if there is a self-dependency relationship) in a correlation graph can be constructed as below: 1) if one or more variables or data structures can be written by the processing procedure of the event type A and at least one of the variables or data structures will be read or quoted in the processing procedure of the type B, then the event Type B depends on the event type A; 2) if the event type A and the event type B will perform a write operation on at least one same variable or data structure in the processing procedure, then the event type A and the event type B depend on each other.

In one embodiment of the present invention, when judging whether or not the second event can be executed in parallel with the first event, first the corresponding nodes 1 (the first event) and 2 (the second event) are found in the correlation graph. If one or more directed paths exist from the node 1 to the node 2, then the paths should be subjected to an analysis as below:

1) If there is one path indicating that the node 2 directly depends on the node 1 (according to the foregoing graphical sign, the path is a single-segment solid line), then the second event cannot be executed in parallel. Otherwise, the following path type can be further checked;

2) If the node 2 directly depends on an arbitrary node 3 (the node 3 can be the node 2 but never the node 1), and an event at the node 3 can be directly or indirectly created by the first event (that is, created by one creation relationship or multiple consecutive creation relationships), then further judgment can be made using the above-described method of analyzing a temporal correlation distance. If all paths that satisfy this condition allow parallel execution, then the second event can be executed in parallel with the first event; otherwise, the second event can not be executed in parallel with the first event.

Besides the above two kinds of paths, other directed connection paths from the node 1 to the node 2 have no impact on the judgment of parallelism between the current first and second events.

It should be noted that the data structure illustrated above is merely an example for implementing a method according to the present invention.

Figure 9:
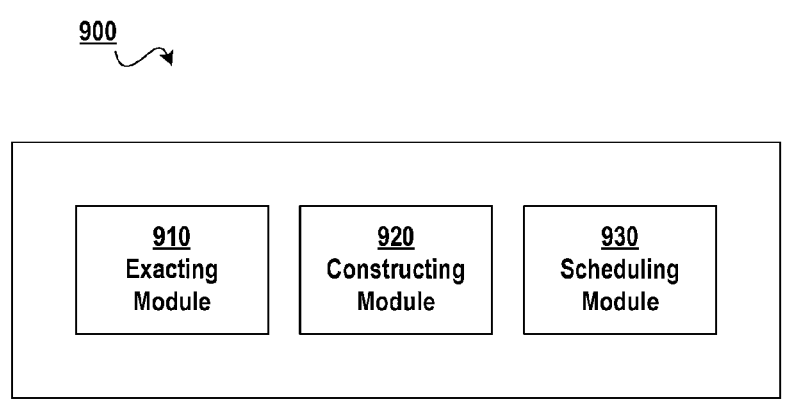
FIG. 9 illustrates a schematic view of an apparatus for scheduling discrete event simulation according to one embodiment of the present invention.

FIG. 9 illustrates a schematic view 900 of an apparatus for scheduling discrete event simulation according to one embodiment of the present invention. The apparatus includes: an Extracting Module 910 configured to extract two or more event types in the discrete event simulation in response to having loaded the discrete event simulation; a Constructing Module 920 configured to construct a correlation graph used for the discrete event simulation based on the two or more event types; and a Scheduling Module 930 configured to schedule events that are classified into the two or more event types according to the correlation graph, wherein each node in the correlation graph describes one of the two or more event types, and an edge in the correlation graph describes a creation relationship or a dependency relationship between the two or more event types.

In one embodiment of the present invention, the Constructing Module 920 includes: an obtaining module configured to, for one of the two or more event types, obtain an event type of a new event that is created by an event classified into the event type; and a first constructing module configured to construct a creation relationship between the event type and the event type of the new event.

In one embodiment of the present invention, the Constructing Module 920 includes: a second constructing module configured to construct a dependency relationship between the two or more event types by analyzing the discrete event simulation and based on scenario configuration of the discrete event simulation.

In one embodiment of the present invention, the edge in the correlation graph describing a creation relationship includes a temporal correlation value of the creation relationship, the temporal correlation value representing an interval between the time when an event classified into an event type related to the edge is created and the occurrence time of the event.

In one embodiment of the present invention, the Scheduling Module 930 includes: for a first and second event that is classified into the two or more even types, a calculating module configured to calculate a time difference between the occurrence time of the second event and the occurrence time of the first event; a parallel executing module configured to execute the second event in parallel with the first event if the time difference is less than a temporal correlation distance between an event type of the second event and an event type of the first event.

In one embodiment of the present invention, the temporal correlation distance between the event type of the second event and the event type of the first event is equal to a sum of minimum temporal correlation values of creation relationships between a second node representing the event type of the second event and a first node representing the event type of the first event.

In one embodiment of the present invention, the second event is an event on an event calendar of the discrete event simulation.

In one embodiment of the present invention, the first event is an event that is being executed or a to-be-processed event whose occurrence time is before the second event on the event calendar.

In one embodiment of the present invention, the parallel executing module includes: an executing module configured to execute the second event by using the idle computing resources in response to the existence of idle computing resources; and a removing module configured to remove the second event from the event calendar after the second event is put into an execution.

In one embodiment of the present invention, the apparatus is implemented in a multicore processor system.

Figure 10:
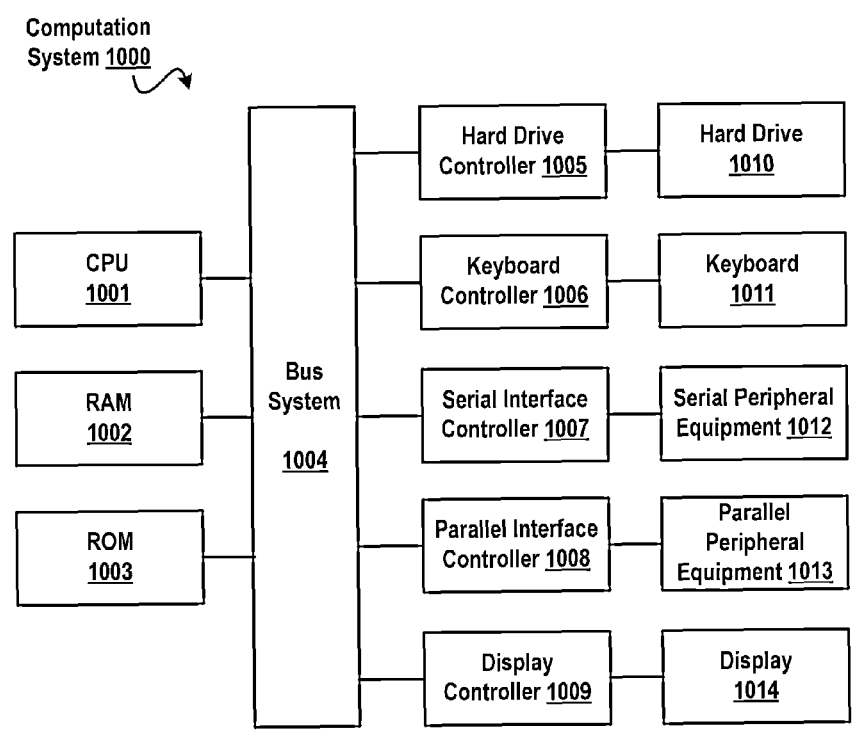
FIG. 10 illustrates an exemplary computation system 1000 which is applicable to implement the embodiments of the present invention.

FIG. 10 illustrates an exemplary Computation System 1000 which is applicable to implement the embodiments of the present invention. As illustrated in FIG. 10, Computation System 1000 can include: CPU (Central Process Unit) 1001, RAM (Random Access Memory) 1002, ROM (Read Only Memory) 1003, System Bus 1004, Hard Drive Controller 1005, Keyboard Controller 1006, Serial Interface Controller 1007, Parallel Interface Controller 1008, Display Controller 1009, Hard Drive 1010, Keyboard 1011, Serial Peripheral Equipment 1012, Parallel Peripheral Equipment 1013, and Display 1014. Among above devices, CPU 1001, RAM 1002, ROM 1003, Hard Drive Controller 1005, Keyboard Controller 1006, Serial Interface Controller 1007, Parallel Interface Controller 1008, and Display Controller 1009 are coupled to the System Bus 1004. Hard Drive 1010 is coupled to Hard Drive Controller 1005. Keyboard 1011 is coupled to Keyboard Controller 1006. Serial Peripheral Equipment 1012 is coupled to Serial Interface Controller 1007. Parallel Peripheral Equipment 1013 is coupled to Parallel Interface Controller 1008. And, Display 1014 is coupled to Display Controller 1009. It should be understood that the structure as illustrated in FIG. 10 is only for the exemplary purpose rather than any limitation to the present invention. In some cases, some devices can be added to or removed from the Computation System 1000 based on specific situations.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of code, which includes one or more executable instructions for implementing the specified logical function(s). It should also be noted that, in some alternative implementations, the functions noted in the block can occur out of the order noted in the figures. For example, two blocks illustrated in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, and to enable others of ordinary skill in the art to understand the embodiments disclosed herein.

What is claimed is:

1. A method for scheduling discrete event simulation, comprising:
   extracting, by an extracting module implemented in at least one computer circuit, two or more event types in the discrete event simulation in response to having loaded the discrete event simulation, the two or more event types including a first event type and a second event type, events in the discrete event simulation initially ordered such that a second event of the second event type is targeted for processing after a first event of the first event type completes;
   constructing, by a constructing module implemented in the at least one computer circuit, a correlation graph used for the discrete event simulation based on the two or more event types, the correlation graph revealing that the first event type and the second event type have neither a creation relationship nor a dependency relationship, based upon a temporal correlation distance between the first event type and the second event type; and
   scheduling, by a scheduling module implemented in the at least one computer circuit, the events that are classified into the two or more event types, according to the correlation graph, wherein each node in the correlation graph describes one of the two or more event types, and an edge in the correlation graph describes the creation relationship or the dependency relationship between the two or more event types, the events reordered after the scheduling such that the second event is targeted for processing before the first event completes.

2. The method according to claim 1, wherein the constructing a correlation graph used for the discrete event simulation based on the two or more event types comprises:
   obtaining an event type of a new event that is created by an event classified into the event type, for one of the two or more event types; and
   constructing a creation relationship between the event type and the event type of the new event.

3. The method according to claim 1, wherein the constructing a correlation graph used for the discrete event simulation based on the two or more event types includes constructing a dependency relationship between the two or more event types by analyzing the discrete event simulation and is based on scenario configuration of the discrete event simulation.

4. The method according to claim 1, wherein an edge in the correlation graph which describes a creation relationship includes a temporal correlation value of the creation relationship representing an interval between the time when an event classified into an event type related to the edge is created and the occurrence time of the event.

5. The method according to claim 4, wherein the scheduling events for the first event and the second event that are classified into the two or more event types according to the correlation graph, comprises:
   calculating a time difference between the occurrence time of the second event and the occurrence time of the first event; and
   executing the second event in parallel with the first event if the time difference is less than a temporal correlation distance between an event type of the second event and an event type of the first event.

6. The method according to claim 5, wherein the temporal correlation distance between the event type of the second event and the event type of the first event equals a sum of minimum temporal correlation values of creation relationships between a second node representing the event type of the second event and a first node representing the event type of the first event.

7. The method according to claim 6, wherein the second event is an event on an event calendar of the discrete event simulation.

8. The method according to claim 7, wherein the first event is an event that is being executed or a to-be-processed event whose occurrence time is before the second event on the event calendar.

9. The method according to claim 8, wherein the executing the second event in parallel with the first event comprises:
   executing the second event by using idle computing resources in response to existence of the idle computing resources; and
   removing the second event from the event calendar.

10. The method according to claim 1, wherein the method is implemented in a multicore processor system.

11. An apparatus for scheduling discrete event simulation, comprising:
    an extracting module implemented using at least one computer circuit, the extracting module configured to extract two or more event types in the discrete event simulation in response to having loaded the discrete event simulation, the two or more event types including a first event type and a second event type, events in the discrete event simulation initially ordered such that a second event of the second event type is targeted for processing after a first event of the first event type completes;

a constructing module implemented using the at least one computer circuit, the constructing module configured to construct a correlation graph used for the discrete event simulation based on the two or more event types, the correlation graph revealing that the first event type and the second event type have neither a creation relationship nor a dependency relationship, based upon a temporal correlation distance between the first event type and the second event type; and a scheduling module implemented using the at least one computer circuit, the scheduling module configured to schedule the events that are classified into the two or more event types according to the correlation graph, wherein each node in the correlation graph describes one of the two or more event types, and an edge in the correlation graph describes the creation relationship or the dependency relationship between the two or more event types, the events reordered after the scheduling such that the second event is targeted for processing before the first event completes.

12. The apparatus according to claim 11, wherein the constructing module comprises:

an obtaining module configured to, for one of the two or more event types, obtain an event type of a new event that is created by an event classified into the event type; and a first constructing module configured to construct a creation relationship between the event type and the event type of the new event.

13. The apparatus according to claim 11, wherein the constructing module includes a second constructing module configured to construct a dependency relationship between the two or more event types by analyzing the discrete event simulation and is based on scenario configuration of the discrete event simulation.

14. The apparatus according to claim 11, wherein an edge in the correlation graph which describes a creation relationship includes a temporal correlation value of the creation relationship representing an interval between the time when an event classified into an event type related to the edge is created and the occurrence time of the event.

15. The apparatus according to claim 14, wherein the scheduling module for the first event and the second event that are classified into the two or more event types, comprises:

a calculating module configured to calculate a time difference between the occurrence time of the second event and the occurrence time of the first event; and a parallel executing module configured to execute the second event in parallel with the first event if the time difference is less than a temporal correlation distance between an event type of the second event and an event type of the first event.

16. The apparatus according to claim 15, wherein the temporal correlation distance between the event type of the second event and the event type of the first event is equal to a sum of minimum temporal correlation values of creation relationships between a second node representing the event type of the second event and a first node representing the event type of the first event.

17. The apparatus according to claim 16, wherein the second event is an event on an event calendar of the discrete event simulation.

18. The apparatus according to claim 17, wherein the first event is an event that is being executed or a to-be-processed event whose occurrence time is before the second event on the event calendar.

19. The apparatus according to claim 18, wherein the parallel executing module comprises:

an executing module configured to execute the second event by using idle computing resources in response to existence of the idle computing resources; and a removing module configured to remove the second event from the event calendar.

20. A non-transitory article of manufacture tangibly embodying computer readable instructions, which when implemented, cause a computer to perform the steps of scheduling discrete event simulation, said method comprising the steps of:

extracting, by the computer, two or more event types in the discrete event simulation in response to having loaded the discrete event simulation, the two or more event types including a first event type and a second event type, events in the discrete event simulation initially ordered such that a second event of the second event type is targeted for processing after a first event of the first event type completes;

constructing, by the computer, a correlation graph used for the discrete event simulation based on the two or more event types, the correlation graph revealing that the first event type and the second event type have neither a creation relationship nor a dependency relationship, based upon a temporal correlation distance between the first event type and the second event type; and scheduling, by the computer, events that are classified into the two or more event types, according to the correlation graph, wherein each node in the correlation graph describes one of the two or more event types, and an edge in the correlation graph describes the creation relationship or the dependency relationship between the two or more event types, the events reordered after the scheduling such that the second event is targeted for processing before the first event completes.

* * * * *